United States Patent
Billman et al.

(10) Patent No.: US 6,659,808 B2
(45) Date of Patent: Dec. 9, 2003

(54) ELECTRICAL CONNECTOR ASSEMBLY HAVING IMPROVED GUIDING MEANS

(75) Inventors: Timothy B. Billman, Dover, PA (US); Charles S. Pickles, York, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 3 days.

(21) Appl. No.: 10/150,845

(22) Filed: May 17, 2002

(65) Prior Publication Data

US 2002/0127903 A1 Sep. 12, 2002

Related U.S. Application Data

(63) Continuation-in-part of application No. 09/746,088, filed on Dec. 21, 2000, now Pat. No. 6,390,857.

(51) Int. Cl.[7] .............................................. H01R 13/64
(52) U.S. Cl. ...................................... 439/680; 439/701
(58) Field of Search ........................ 439/680, 79, 701, 439/608, 65, 377, 55, 59, 636, 637, 61, 62, 64, 67, 74, 77, 76.1

(56) References Cited

U.S. PATENT DOCUMENTS 6,390,857 B1 * 5/2002 Pickles et al. .............. 439/680

* cited by examiner

Primary Examiner—Ross Gushi
(74) Attorney, Agent, or Firm—Wei Te Chung

(57) ABSTRACT

A male connector (10) includes first and second individual housing portions (28, 30) engaging with each other, a number of substrates (16) held by the first housing portion and a number of signal contacts (18) and a number of grounding terminals (20) held by the second housing portion with the signal contacts confronting the grounding terminals. Each substrate has a first edge (108) and a second edge (110) orthogonal with the first edge. The first edges of the substrates are hidden behind corresponding lead-in bars (44) of the first housing portion and the second edges of the substrates are sandwiched between and removeably held by the signal contacts and the grounding terminals. The second edges are pushed toward the signal contacts by the grounding terminals because the grounding terminals are stronger than the signal contacts. A female connector (12) mateable with the male connector includes a dielectric member (22) and a number of signal contacts (24) and a number of grounding terminals (26) retained in the dielectric member in face-to-face relationship. The signal contacts straddle on a bottom surface (128) of the dielectric member. The male and the female connectors have a guiding means for guiding the connectors to correctly mate with each other.

12 Claims, 16 Drawing Sheets

ELECTRICAL CONNECTOR ASSEMBLY HAVING IMPROVED GUIDING MEANS

CROSS-REFERENCES TO RELATED APPLICATIONS

This patent application is a continued-in-part (CIP) application of patent application Ser. No. 09/746,088, filed on Dec. 21, 2000 now U.S. Pat. No. 6,390,857, and a Co-pending Application of Patent Application with an unknown serial number, entitled "ELECTRICAL CONNECTOR HAVING IMPROVED GROUNDING TERMINALS", invented by the same inventors as this patent application, another co-pending application of application with an unknown serial number, entitled "ELECTRICAL CONNECTOR HAVING PRINTED SUBSTRATES THEREIN ELECTRICALLY CONTACTING CONDUCTIVE CONTACTS THEREOF BY SOLDERLESS", invented by the same inventors as this patent application; and another co-pending application with an unknown serial number, entitled "ELECTRICAL CONNECTOR HAVING IMPROVED CONTACTS", invented by Timothy Brain Billman, all assigned to the same assignee and filed on the same date with this application. U.S. Pat. No. 6,375,508 is also related hereto.

BACKGROUND OF THE INVENTION

1. Field of the Invention

The present invention relates to an electrical connector assembly, and particularly to an electrical connector assembly having improved guiding means for accurately guiding a male connector thereof to mate with a female connector thereof.

2. Description of the Related Art

Fleck Research, the worldwide leader in information technology and market intelligence, announced an article, entitled "A View from the Backplane", on Jan. 07, 2002 at the website, http://www.fleckresearch.com/news/en$_{13}$99-10-18.htm. This article introduced some backplane connectors, for example, Teradyne and Molex's HDM (High Density Metric) family of 2.0 mm connectors, FCI's (Berg) Metral HB connectors, FCI's new HMHS (Hard Metric High Speed) connector and AMP's Z-PACK HS3 connector. These connectors have common features of high-density, high-speed and strict demand for impedance and crosstalk control.

U.S. Pat. Nos. 6,171,115 and 6,267,604, both issued to Tyco Electronics Corporation, each disclose a backplane connector including a dielectric housing and a plurality of circuit boards held in the housing. The housing includes a front housing and an organizer engaging with the front housing. Each circuit board provides a plurality of conductive tracks extending from a mating interface thereof to a mounting edge thereof. The mating interface extends beyond the front housing to mate with a mating connector. The mounting edge is secured with conductive terminals by soldering before the mounting edge and the terminals are inserted in slots of the organizer. U.S. Pat. No. 6,083,047, issued to Berg Technology, Inc., discloses an alternate backplane connector including a connector body of dielectric material and a plurality of integrated PCB modules arranged parallel, side-by-side inserted to the connector body. Each PCB module includes a pair of substrates, a plurality of terminals soldered onto an inner surface of each substrate and an insulating spacer sandwiched between the inner surfaces of the substrates. U.S. Pat. No. 6,168,469, issued to Hon Hai Precision Ind. Co., Ltd. discloses a similar backplane connector that the contacts are soldered to printed circuit boards. These connectors have several disadvantages. First, it requires a step of soldering the contacts to the substrates by Surface Mounting Technology (SMT). The SMT requires expensive machine, thereby increasing the manufacturing cost of the connectors. Second, when the substrates, which are originally designed for signal transmission are required to be replaced by substrates for power transmission, the substrates together with the contacts must be discarded. This is not economy. Third, there is no means for guiding contacts of a mating connector to engage with the mating surface of the substrates. Therefore, there is a disadvantage that noble metal plated on contacting portions of the signal contacts may wear off due to their wiping action against the corners of the edge of the substrate.

U.S. Pat. Nos. 6,293,827 and 6,174,202, both issued to Teradyne Inc., U.S. Pat. No. 6,343,955, issued to Berg Technology Inc., and U.S. Pat. No. 6,299,484, issued to Framatome Connectors International (FCI), each disclose a backplane connector having a plurality of contacts stamped and formed from metal ribs. Each contact has a mating end for engaging with a contact of a mating connector and a mounting end for mounting to a mother board. These contacts are relatively long and manufactured costly.

U.S. Pat. No. 5,980,321, issued to Teradyne Inc., and U.S. Pat. No. 6,220,896, issued to Berg technology Inc., each disclose a backplane connector including a plate between every two rows of signal contacts. One of the disadvantages of these backplane connectors is that the grounding plate has no spring arm for reliably contacting a corresponding grounding element of a mating connector. So, disconnection may happen between the grounding plate of this backplane connector and the grounding element of the mating connector. Hence, an improved electrical connector is required to overcome the disadvantages of the prior art.

SUMMARY OF THE INVENTION

A first objective of the present invention is to provide an electrical connector having substrates therein moveably engage with corresponding conductive contacts thereof such that it is very convenient to replace some of the substrates with other devices.

A second objective of the present invention is to provide an electrical connector having means located in front of substrates thereof for guiding contacts of a mating connector to contact corresponding conductive elements on the substrates.

A third objective of the present invention is to provide an electrical connector assembly having an improved guiding means for guiding a male connector thereof to correctly mate with a female connector thereof.

A fourth objective of the present invention is to provide an electrical connector having a plurality of contacts that are secured to an insulative member thereof in a unique way.

To obtain the above objectives, an electrical connector assembly comprises a male connector mountable to a first printed circuit board, a female connector mountable to a second printed circuit board and a guiding means for guiding the male connector to mate with the female connector correctly. The male connector include first and second individual housing portions engageable with each other, a plurality of substrates held between the firs and the second housing portions and a plurality of signal contacts and a plurality of grounding terminals attached to the second housing portion in face-to-face relationship. Each substrate has a plurality of first conductive pads adjacent a first edge thereof and a plurality of second conductive pads adjacent a second edge thereof which is orthogonal with the first edge. The first housing portion provides a plurality of wedge-shaped lead-in bars in front of the substrates for guiding contacts of the female connector to contact corresponding first conductive pads of the substrates. The second edges of the substrates extend out of the first housing portion into the second housing portion to be removeably sandwiched between correspond signal contacts and corresponding grounding terminals.

The female connector includes a dielectric member having a plurality of elongate wafers and defining a channel between every two adjacent wafers, a plurality of signal contacts and a plurality of grounding terminals received in the channels with each grounding terminal confronting several signal contacts. Each grounding terminal has four retention latches and eight contacting arms at one side thereof and five tail portions at an opposite side thereof. The contacting arms are sorted in four pairs and between each pair there is a retention latch. Each retention latch has a cap portion at a top end thereof attached to the dielectric member, thereby retaining the grounding terminals to the dielectric member. The contacting arms are configured to engage with grounding elements of the female connector while the tail portions are configured to electrically contact corresponding conductive pads on the second printed circuit board. In a preferred embodiment, the contacting arms of the grounding terminals are somewhat stronger than the contacting portions of the signal contacts, so, the substrates sandwiched by the contacting arms and the contacting portions are pushed by the contacting arms toward the contacting portions to secure the electrical connection between the contacting portions and the second conductive pads. Retention portions of the signal contacts each define a slot such that the retention portions may straddle upon corresponding protrusions on a bottom surface of the dielectric member.

The guiding means includes a pair of frames, which define a chamber between each frame and an outmost lead-in bar of the first housing portion, at opposite ends of the first housing portion and a pair of guiding posts at opposite ends of the dielectric member. The guiding posts are received in corresponding chambers before the first housing portion engages with the dielectric member for guiding the male connector to mate with the female connector. Each frame provides two guiding keys unsymmetrically located in an inner surface thereof and each guiding post defines two guiding cuts in accordance with the guiding keys. The male connector can only mate with the female connector when the guiding keys are accommodated by corresponding guiding cuts, thereby providing anti-blindmating function.

Other objects, advantages and novel features of the invention will become more apparent from the following detailed description of the present embodiment when taken in conjunction with the accompanying drawings.

DESCRIPTION OF THE PREFERRED EMBODIMENT

Figure 1:
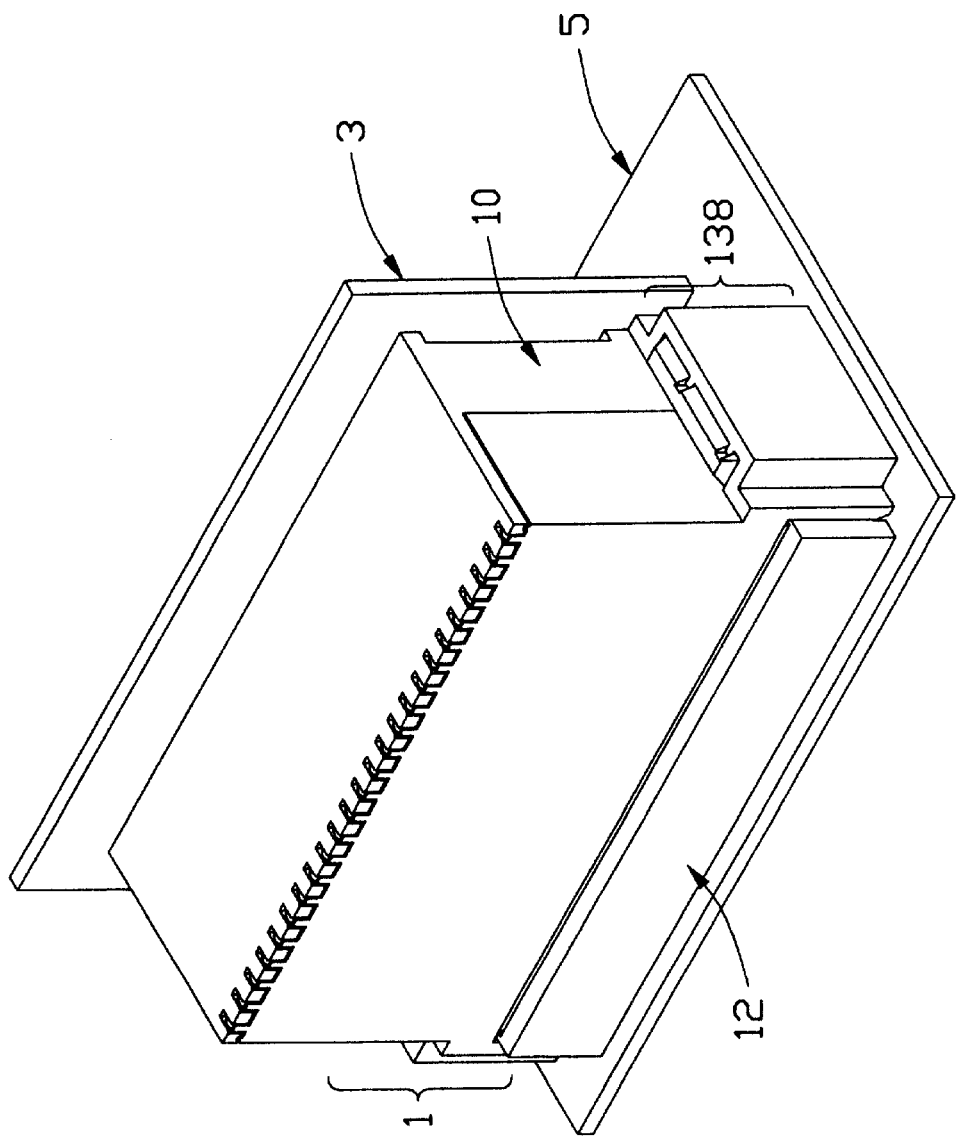
FIG. 1 is an assembled perspective view of a male connector and a female connector respectively mounted onto a first and a second printed circuit boards (PCBs)

Referring to FIGS. 1–3, 6A–8B and 10, an electrical connector assembly 1 of the present invention includes a male connector 10 mounted on a first printed circuit board (PCB) 3 and a female connector 12 mounted on a second PCB 5. The male connector 10 includes an insulative housing 14, a plurality of substrates 16 and a plurality of signal contacts 18 and grounding terminals 20 received in the housing 14. The female connector 12 includes an insulative housing 22, a plurality of signal contacts 24 and grounding terminals 26 received in the housing 22.

Referring to FIGS. 3–9, the housing 14 includes first and second individual housing portions 28, 30 engageable with each other. The first housing portion 28 has a front surface 32 for mating with the female connector 12, a rear surface 34 and a lower surface 36 in orthogonal with the rear surface 34. The first housing portion 28 defines a plurality of passageways 38 through the rear surface 34, the lower surface 36 and terminating at the front surface 32. The first housing portion 28 provides a row of blocks 40 on a top section of the rear surface 34 and two guiding ribs 42 near opposite ends of the row of blocks 40. The guiding ribs 42 downwardly extend throughout the height of the rear surface 34 for guiding the first housing portion 28 to accurately engage with the second housing portion 30. The first housing portion 28 further provides a plurality of lead-in bars 44 near the front surface 32. Each lead-in bar 44 is wedge-shaped in cross-section for facilitating mating with the female connector 12. Each lead-in bar 44 provides three branches 46 rearwardly extending into a corresponding passageway 38 for securing the substrates 16 in the passageways 38 of the first housing portion 28, respectively. The first housing portion 28 again defines a row of notches 48 (FIG. 5) in a middle surface 50 thereof between and parallel with the front and the rear surfaces 32, 34 for purpose disclosed in detail below.

The second housing portion 30 has a generally sofa-like shape, and includes a rectangular base portion 52 defining a plurality of channels 54 in an upper surface 56 thereof, a backrest portion 58 upwardly extending from a rear edge of the upper surface 56 of the base portion 52 and two elongate stand-offs 60 depending on front and rear edges of a bottom surface 62 of the base portion 52. Between every two near channels 54 there is an elongate wafer 64 which defines four recesses 66 in the upper surface 56 and provides an embossment 68 in each recess 66. The base portion 52 provides a row of blocks 70 on a front face 72 thereof for being engageably received in corresponding notches 48 of the first housing portion 28. The backrest portion 58 defines a row of notches 74 in a top end 76 thereof for engageably receiving corresponding blocks 40 and two guiding tracks 78 at opposite side portions 80 thereof for receiving the guiding ribs 42 of the first housing portion 28.

Figure 9:
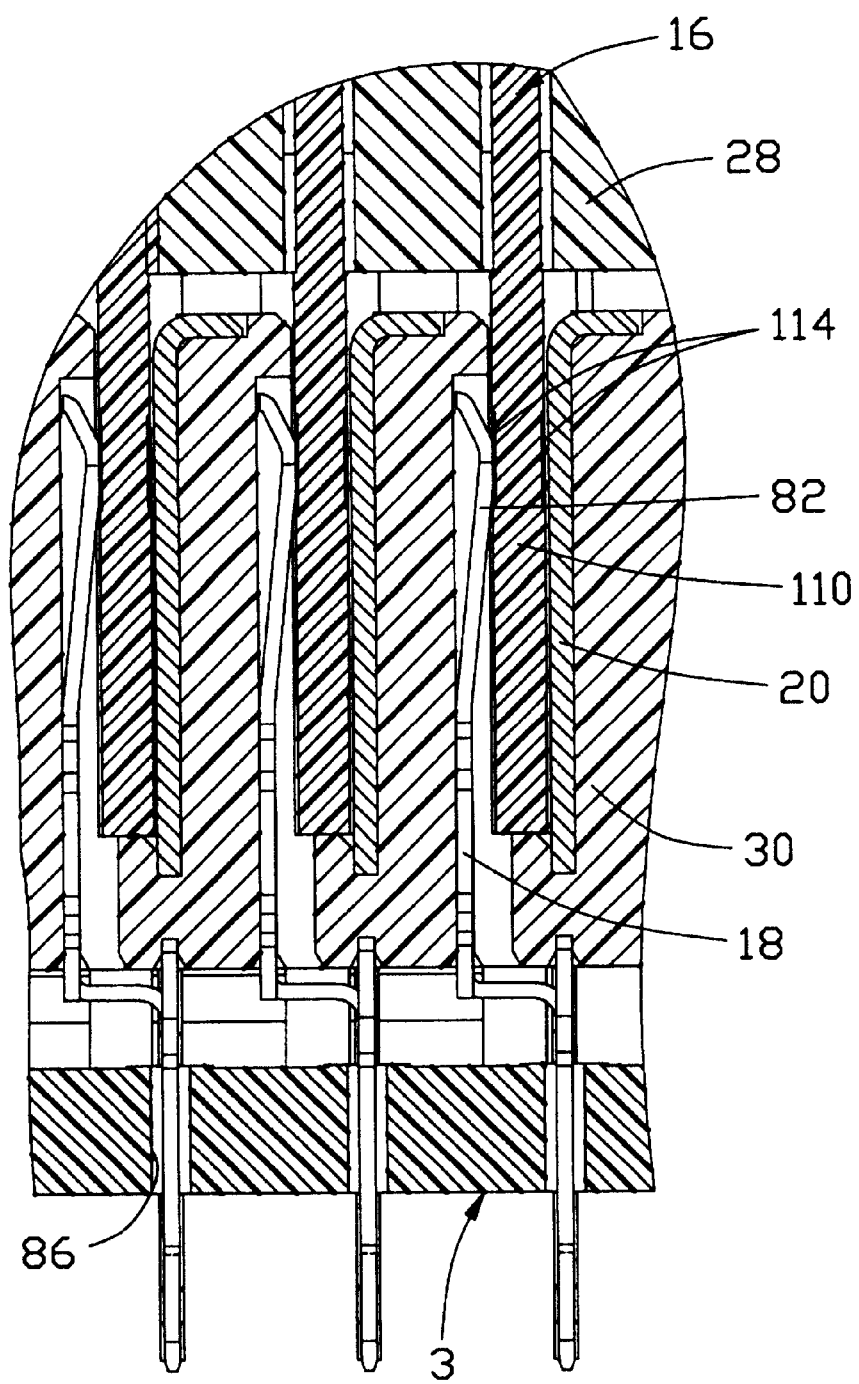
FIG. 9 is a cross-sectional view of a section of the second housing portion and the substrates attached to the second housing portion.

The signal contact 18 includes a contacting portion 82 for mating with the substrate 16 and a tail portion 84 for mating with the first PCB 3. The contacting portion 82 offsets a predetermined distance from the tail portion 84 in a traverse direction of the signal contact 18 (FIG. 9). The tail portion 84 is a press-fit tail for engageably inserting into a corresponding plated hole 86 of the first PCB 3. A signal contact 18' according to a second embodiment has an inclined tail portion 84' for pressing against a corresponding conductive pad 88 of a first PCB 3' according to a second embodiment (FIG. 14) of the present invention. A signal contact 18" according to a third embodiment of the present invention includes a contacting portion 82" having two spring arms 90, a press-fit tail portion 84" and an inclined retention portion 92 between the contacting portion 82" and the tail portion 84". The retention portion 92 defines a slot 94 so that it may straddle upon a bottom surface of the second housing portion 30.

The grounding terminal 20 includes an elongate base portion 96, five press-fit tail portions 98 downwardly extending from a lower side of the base portion 96 and four retention latches 100 and eight contacting arms 102 upwardly extending from an upper side of the base portion 96. Beside opposite sides of each retention latch 100, there are two contacting arms 102. Each retention latch 100 is generally 7-shaped and has a cap portion 104 at a top end thereof. The cap portion 104 defines an opening 106 for receiving a corresponding embossment 68 of the second housing portion 30. The substrate 16 provides a first row of first gold fingers 112 on opposite surfaces near a first edge 108 thereof, a second row of second gold fingers 114 on the opposite surfaces near a second edge 110 thereof and a plurality of traces 116 connecting the first gold fingers 112 to corresponding second gold fingers 114. The first row is perpendicular to the second row. The substrate 116 defines three grooves 118 in the first edge 108 for engageably receiving corresponding branches 46 of a corresponding lead-in bar 44.

Upon the assembling of the male connector 10, the substrates 16 are inserted into corresponding passageways 38 of the first housing portion 28 from the rear surface 34 toward the front surface 32. The first edge 108 of each substrate 16 is hidden behind a corresponding lead-in bar 44 with the grooves 118 thereof engageably receiving corresponding branches 46. The second edge 110 of each substrate 16 partially extends downwardly beyond the lower surface 36 with the second gold fingers 114 exposing out of the first housing portion 28. The signal contacts 18 and the grounding terminals 20 are inserted into corresponding channels 54 of the second housing portion 30 with eight signal contacts 18 lying in one side of the channel 54 and one grounding terminal 20 lying in an opposite side of the channel 54 such that the signal contacts 18 confront the grounding terminal 20. The cap portion 104 of the grounding terminal 20 is received in a corresponding recess 66 with the opening 106 thereof fixedly receiving a corresponding embossment 68, thereby attaching the grounding terminals 20 to the first housing portion 28. The first housing portion 28 together with the substrates 16 are then assembled to the second housing portion 30 such that the second edges 110 of the substrates 16 are received in corresponding channels 54 of the second housing portion 30. The contacting portions 82 of the signal contacts 18 and the contacting arms 102 of the grounding terminals 20 wipe along and electrically contact corresponding second gold fingers 114 of the substrates 16. The second edge 110 of the substrate 16 is sandwiched between the contacting portions 82 of the signal contacts 18 and the contacting arms 102 of the grounding terminal 20. The contacting arms 102 are somewhat stronger than the contacting portions 82 such that the second edge 110 is pushed by the contacting arms 102 toward the contacting portions 82 to ensure electrical connections between the second gold fingers 114 and the contacting portions 82 of the signal contacts 18 (FIG. 9 and FIGS. 13A–13B).

Figure 10:
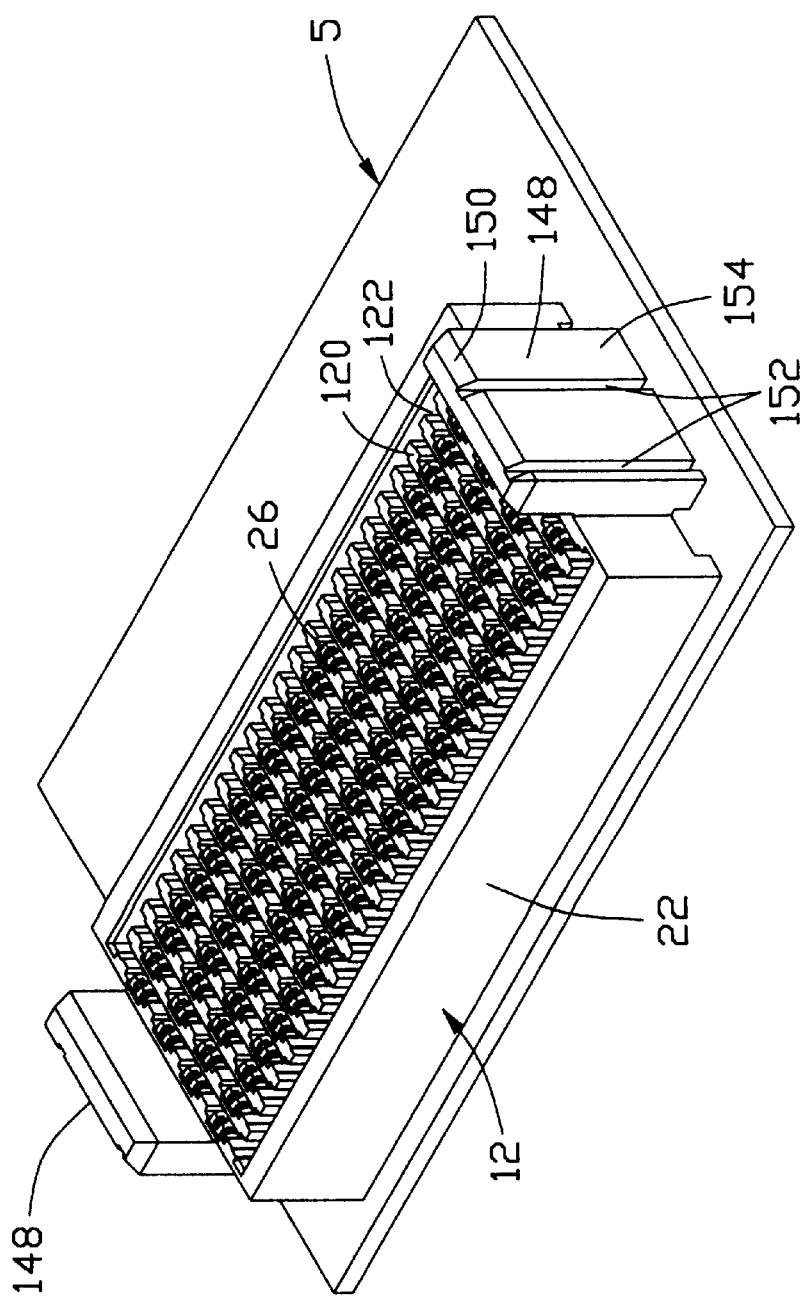
FIG. 10 is a top-front perspective view of the female connector mounted on the second PCB.
Figure 11A:
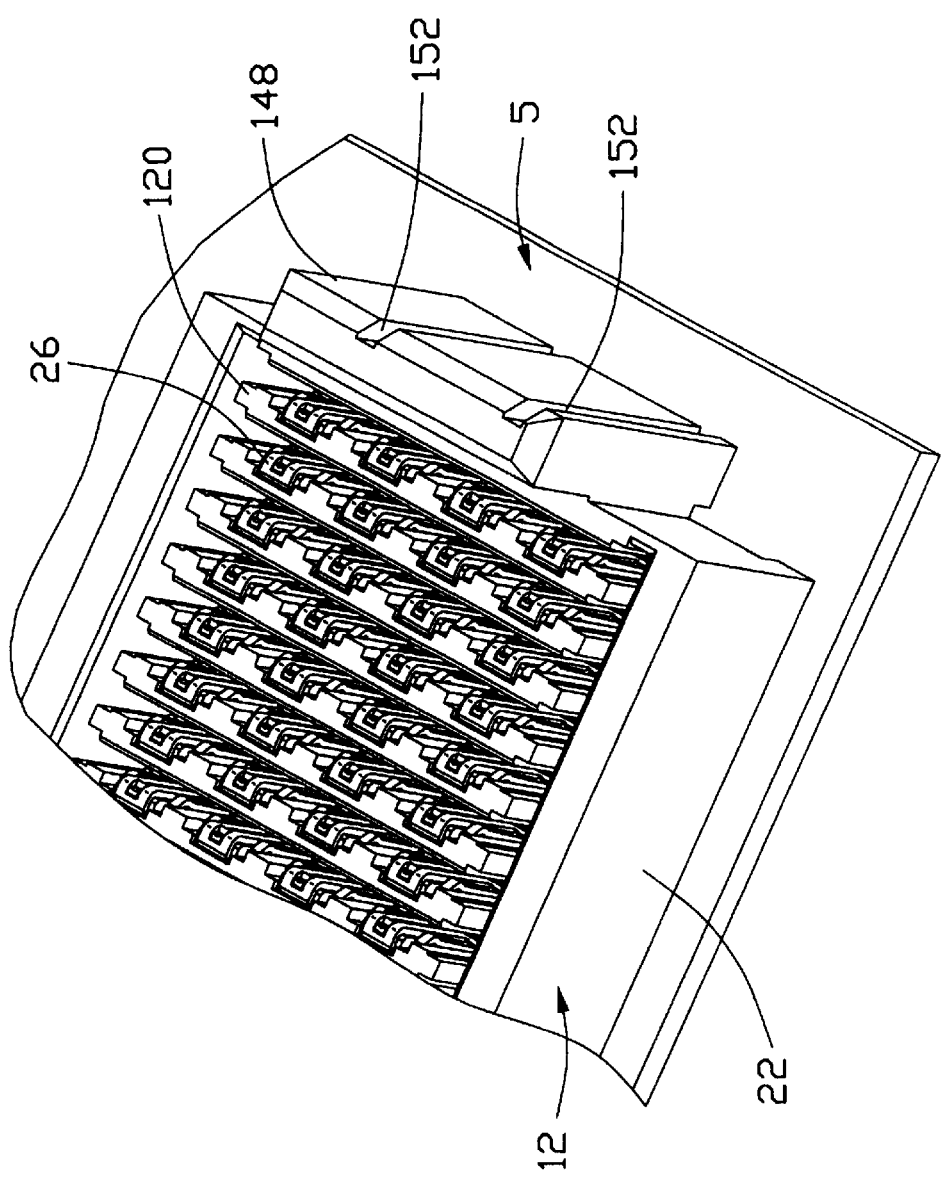
FIGS. 11A–11B are enlarged top and bottom perspective views of a section of the female connector in FIG. 10.
Figure 11B:
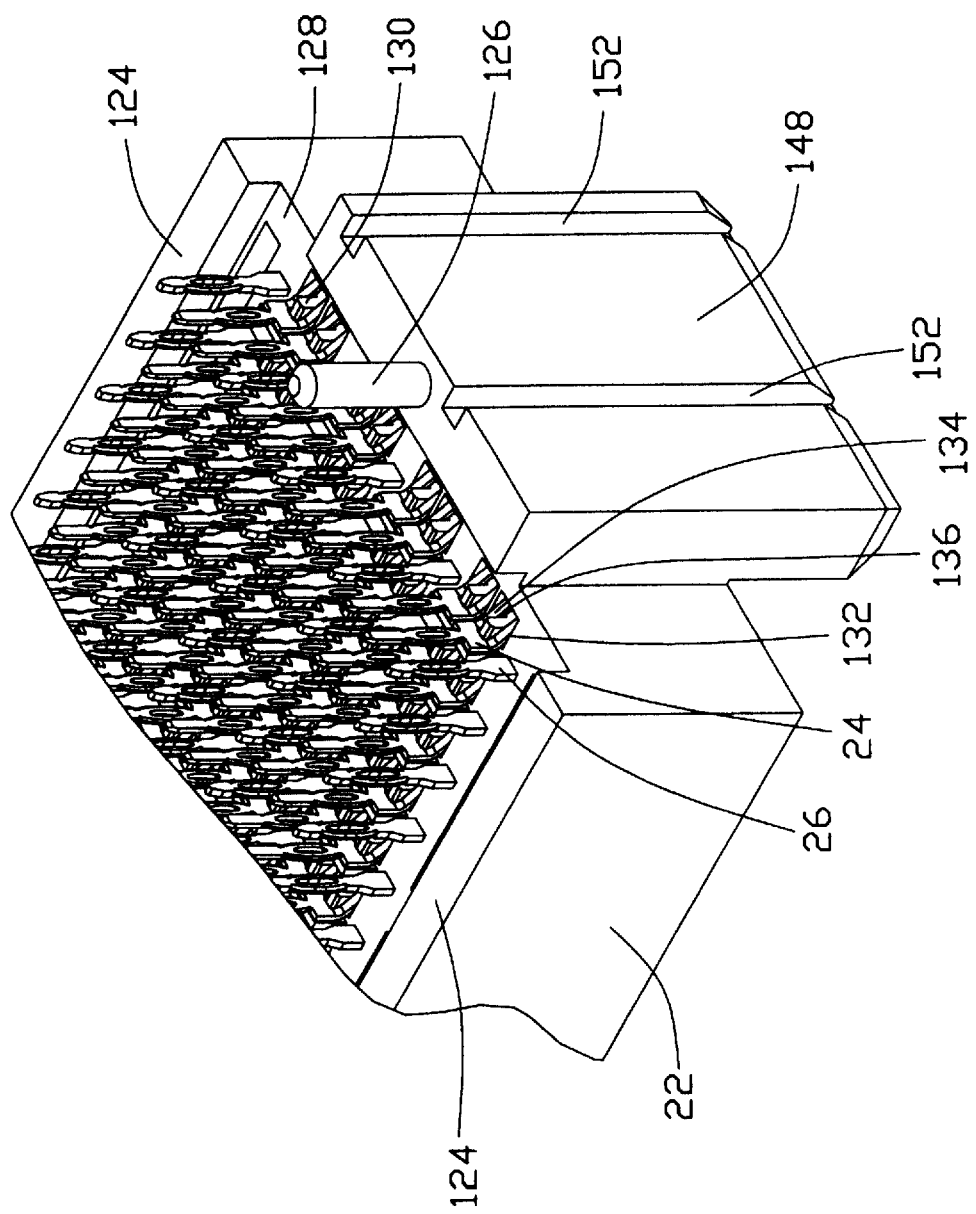

Referring to FIGS. 10, 11A and 11B, the housing 22 of the female connector 12 provides a plurality of elongate wafers 120 and defines a plurality of channels 122 each between two near wafers 120. Each channel 122 receives eight signal contacts 24 and a grounding terminal 26 at opposite sides thereof. The signal contact 24 and the grounding terminal 26 of the female connector 12 are respectively similar to the signal contact 18" and the grounding terminal 20 of the male connector 10 in structure but different in dimensions. The housing 22 provides a pair of elongate stand-offs 124 and a pair of guiding poles 126 (only one is shown in FIG. 11B) on a bottom surface 128 thereof. The housing 22 further provides a plurality of protrusions 130 on the bottom surface 128. The signal contact 24 includes an inclined retention portion 132 having a pair of ribs 134 and defining a slot 136 between the ribs 134. The retention portion 132 straddles on the protrusion 130 with the ribs engageably sandwiching the protrusion 130, thereby assisting retaining the signal contact 24 to the housing 22.

Figure 12:
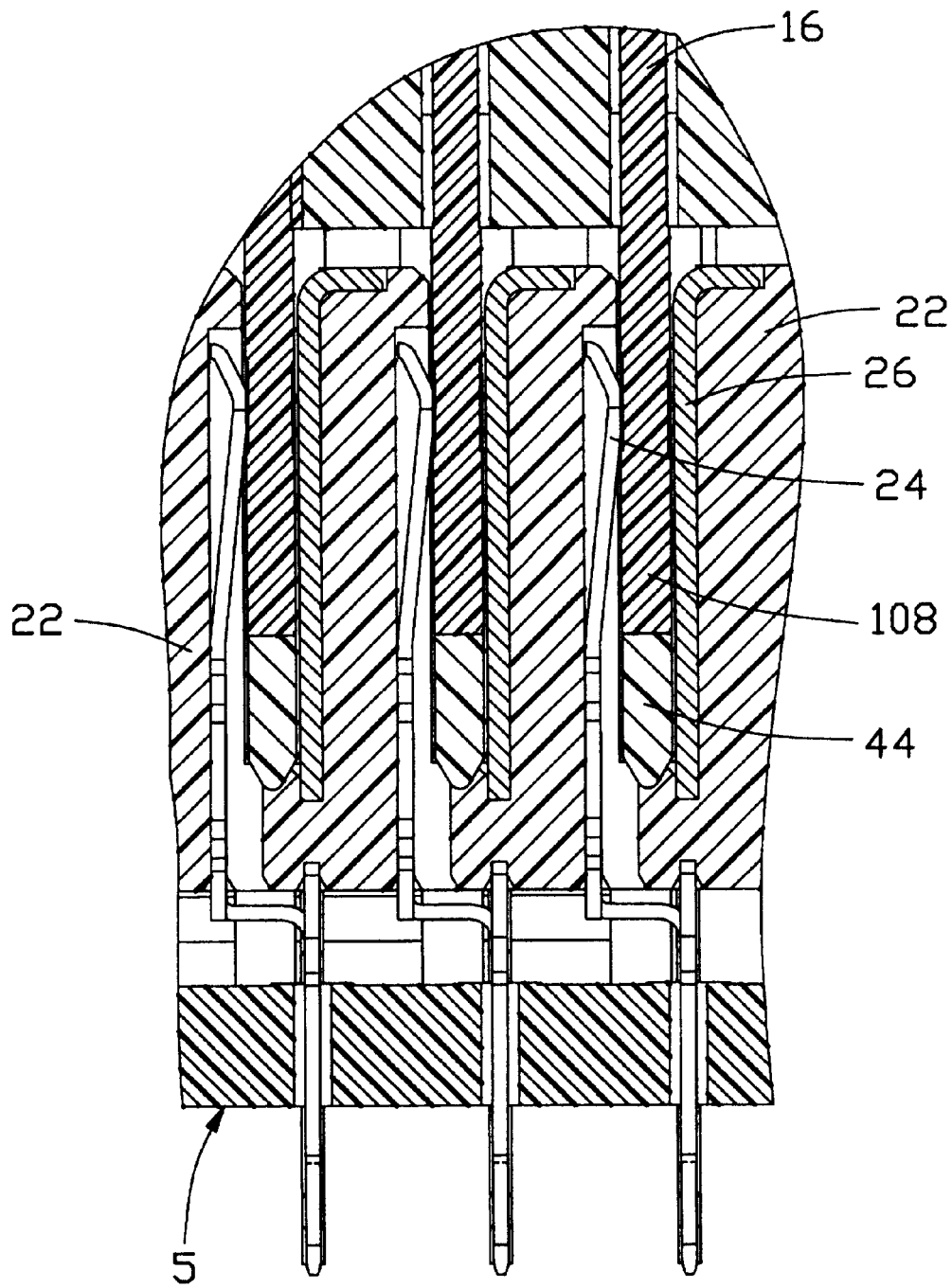
FIG. 12 is an enlarged cross-sectional view of a section of the assembly of the male and the female connectors.
Figure 13A:
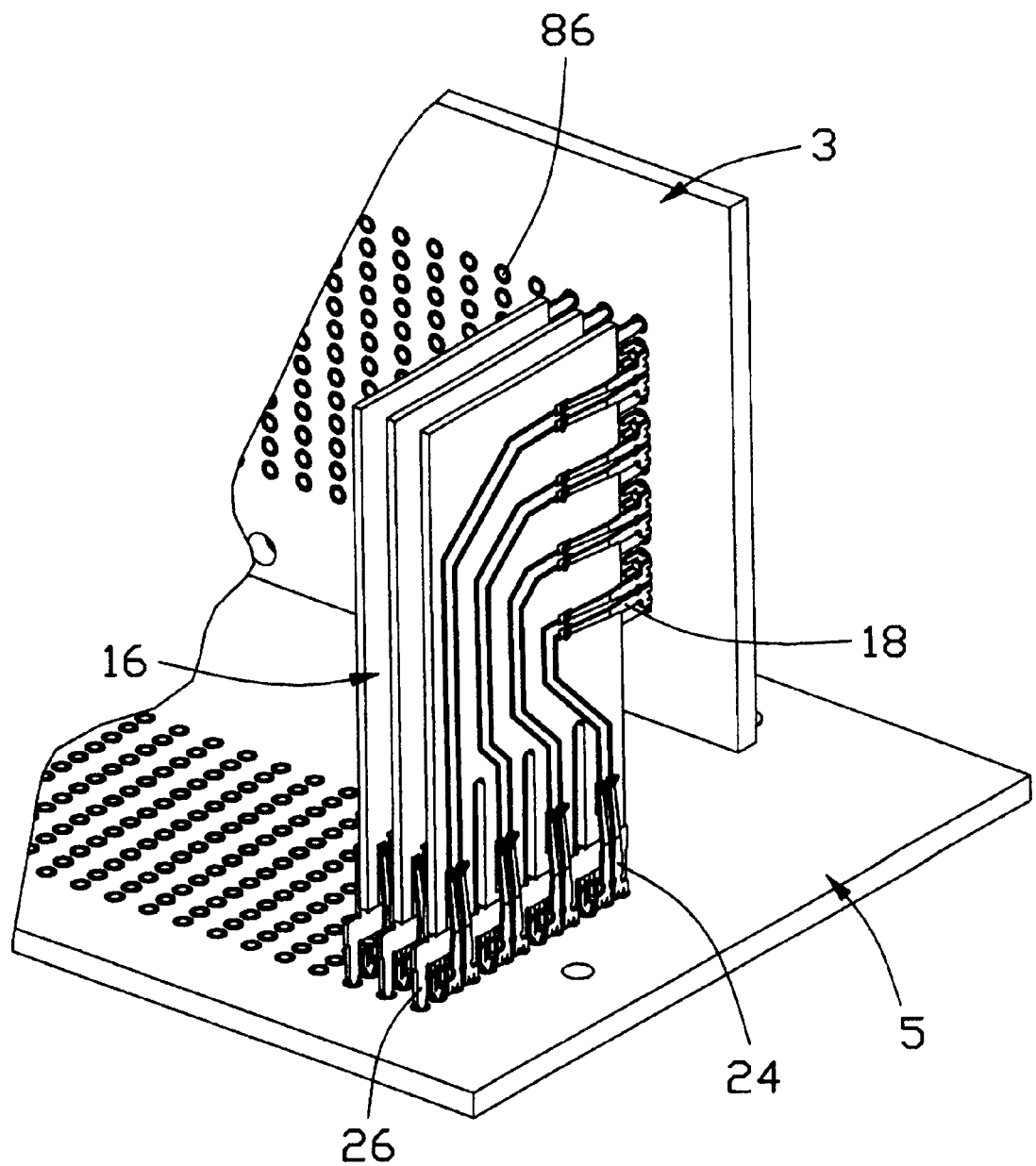
FIGS. 13A–13B are perspective views of the assembly of the male and female connectors taken from different perspectives, wherein the housings are removed to clearly show the engagement of the substrates with the signal contacts and the grounding terminals.
Figure 13B:
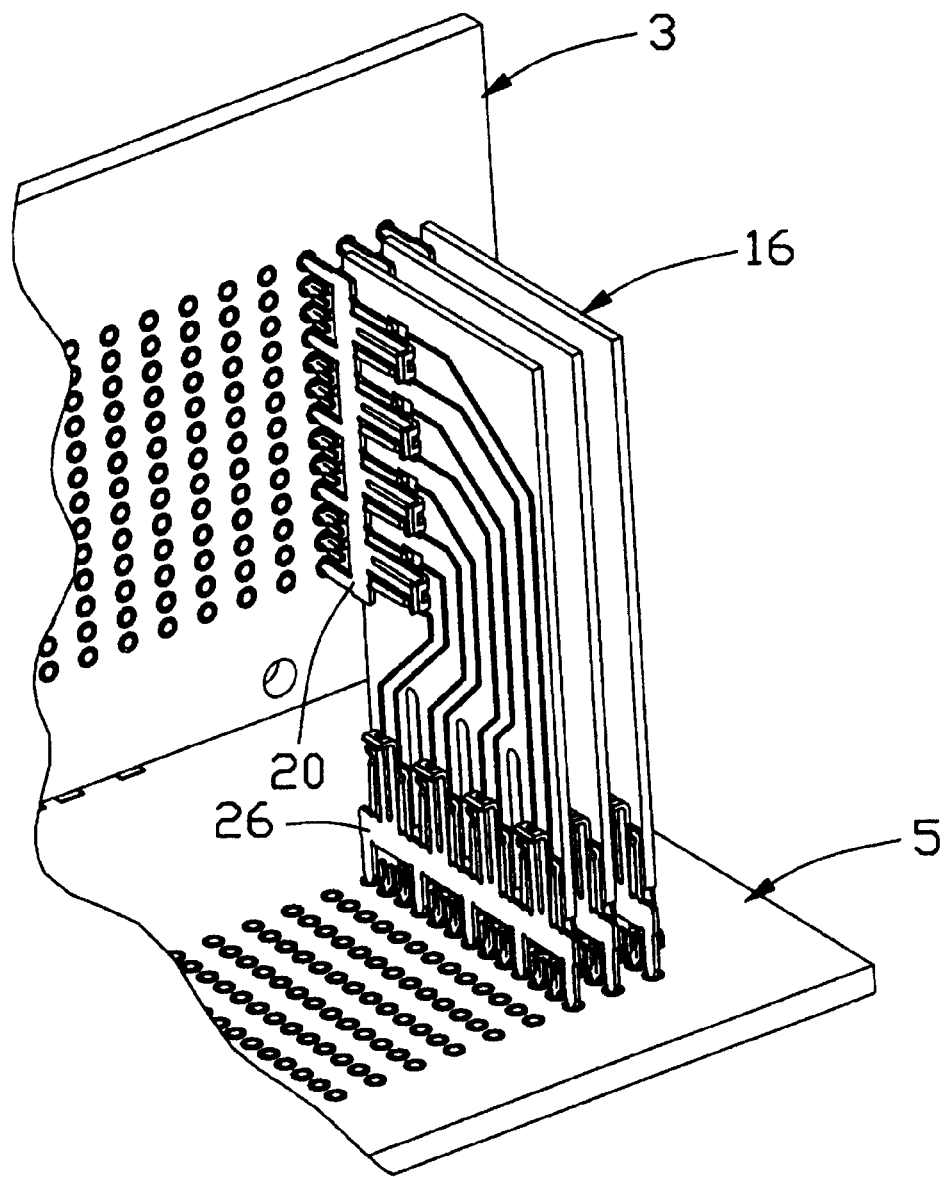

Referring to FIGS. 12 and 13A, 13B, when the male connector 10 mates with the female connector 12, the wedged lead-in bars 44 of the male connector 10 push the contacting portions of corresponding signal contacts 24 and the contacting arms of corresponding grounding terminals 26 to move away from each other so that they may smoothly slide to electrically contact corresponding first gold fingers 112 without wiping against corners of the first edges 108 of the substrates 16. Therefore, a disadvantage that noble metal plated on the contacting portions 82 of the signal contacts may wear off due to their wiping action against the corners of the edge of the substrate 16 can be prevented in the present invention. The tail portions 84, 98 of the signal contacts 18 and the grounding terminals 20 of the male connector 10 arranged in a same row are inserted into a same row of plated holes 86 of the first PCB 3. So does the female connector 12.

Figure 14:
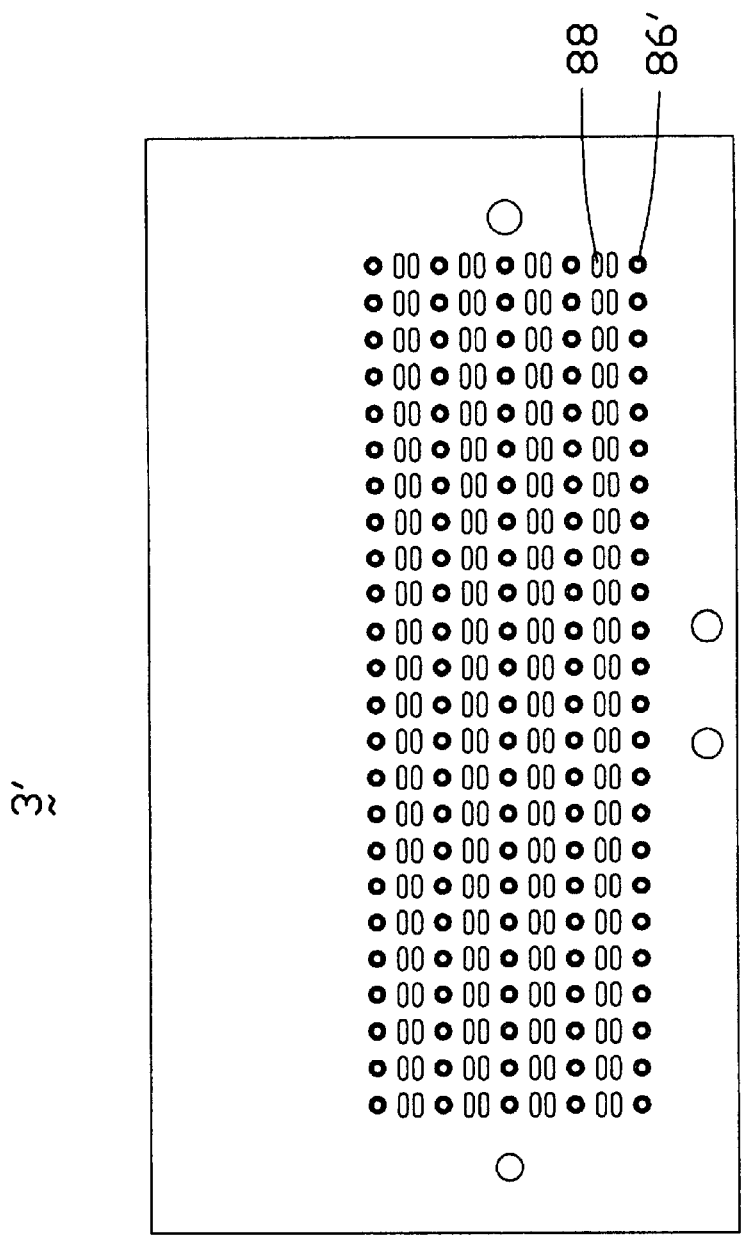
FIG. 14 is a top planar view of a PCB of an alternative embodiment of this invention.

Referring to FIG. 14, in accordance with the signal contacts 18' of the second embodiment, the first PCB 3' of the second embodiment provides five rows of plated through-holes 86' and four pairs of rows of conductive pads 88, each pair being located between every two near rows of plated through-holes 86'. When the male connector 10 is mounted onto the first PCB 3', the tail portions 98 are received in corresponding through-holes 86' by press-fit while the tail portions 84' of the signal contacts 18' electrically contact corresponding conductive pads 88 by a depressing force acting on the tail portions 84'.

Figure 2:
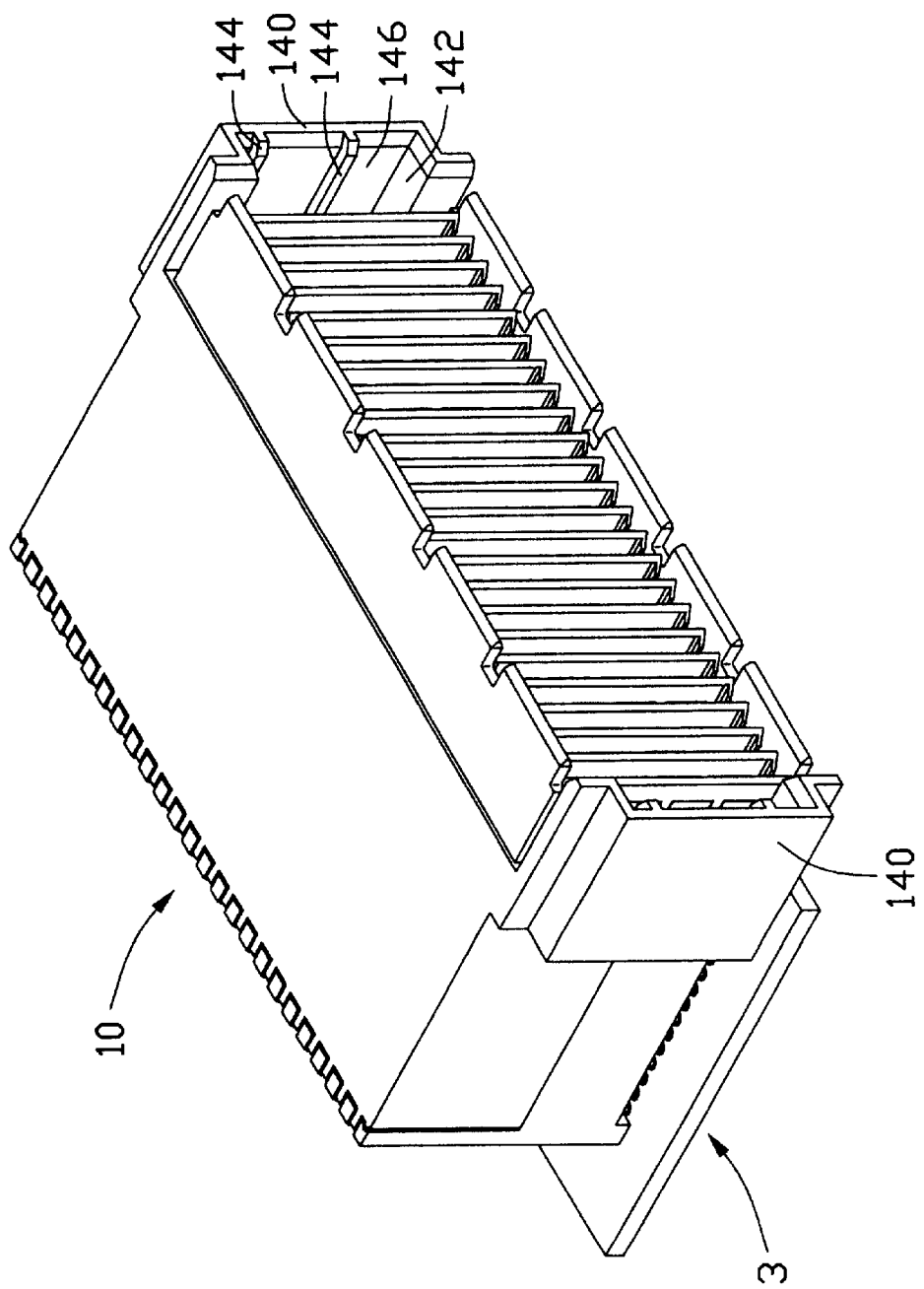
FIG. 2 is a front-top perspective view of the male connector mounted on the first PCB.
Figure 3:
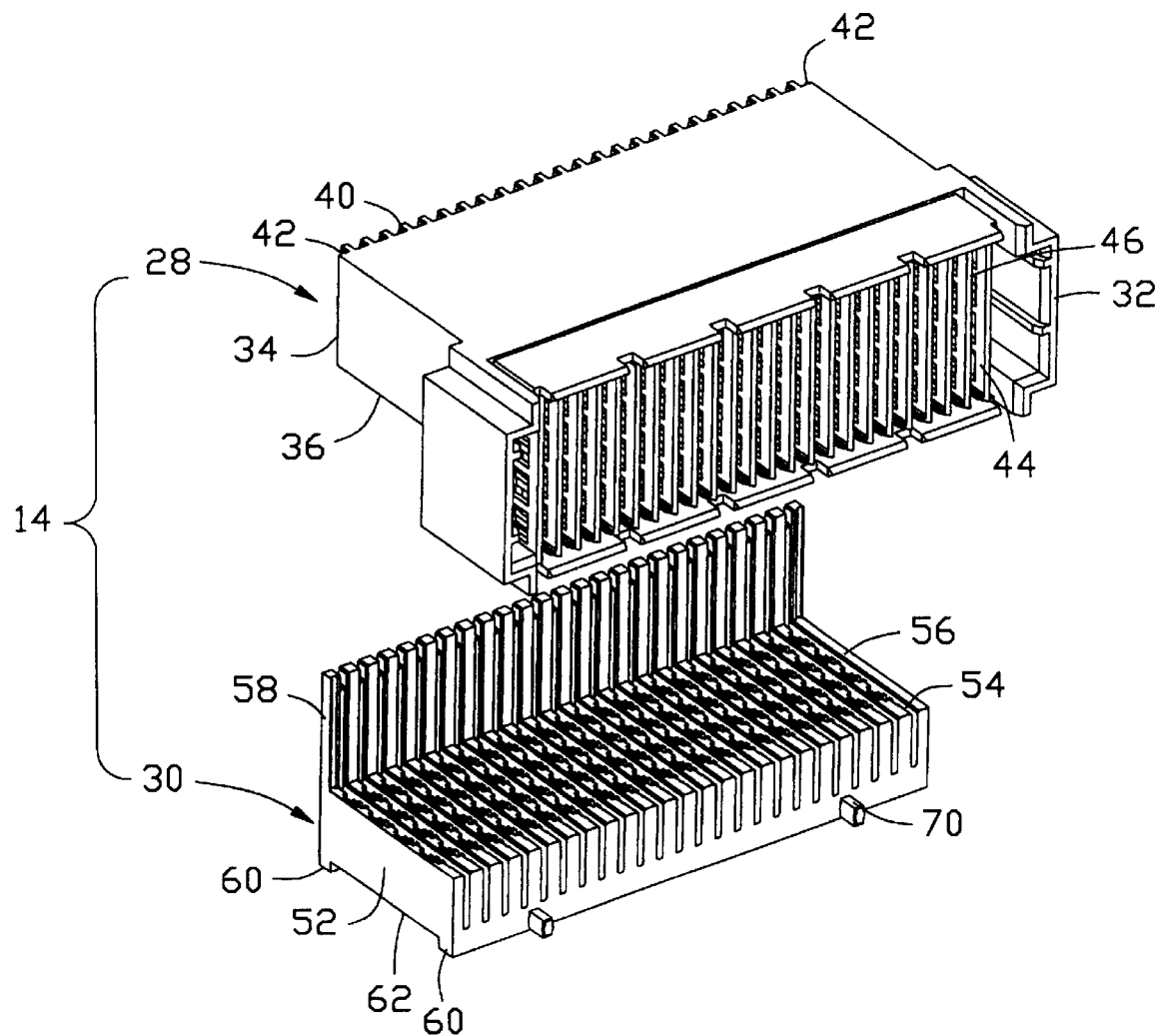
FIG. 3 is an exploded perspective view of first and second housing portions of the male connector.
Figure 4B:
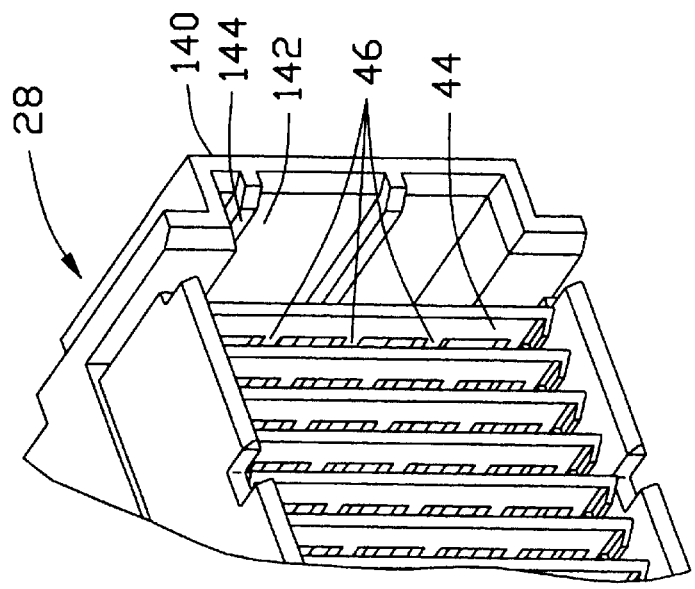
FIGS. 4A and 4B are enlarged sections of FIG. 3.
Figure 4A:
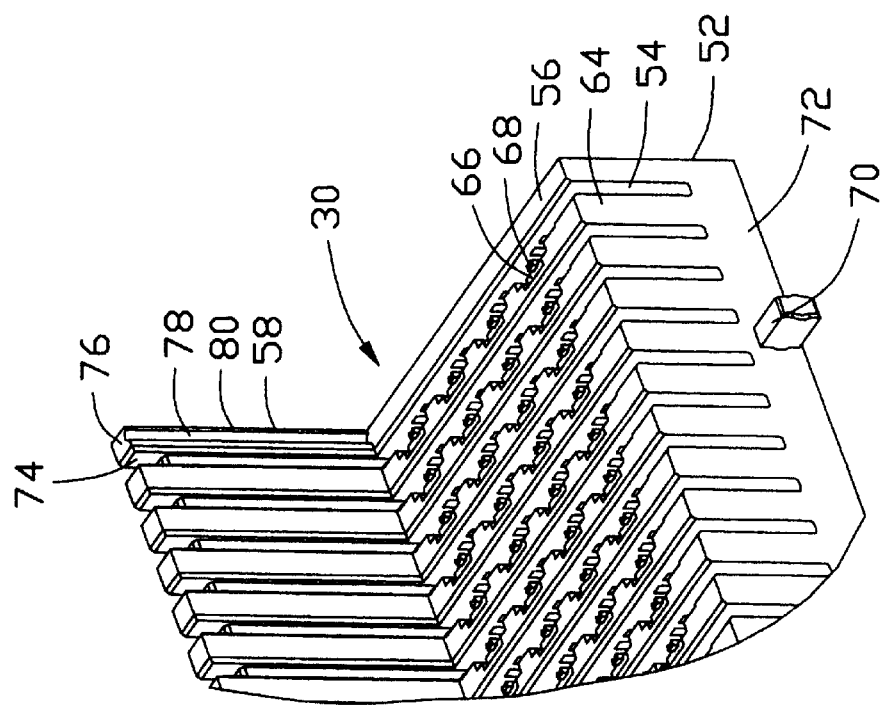
Figure 5:
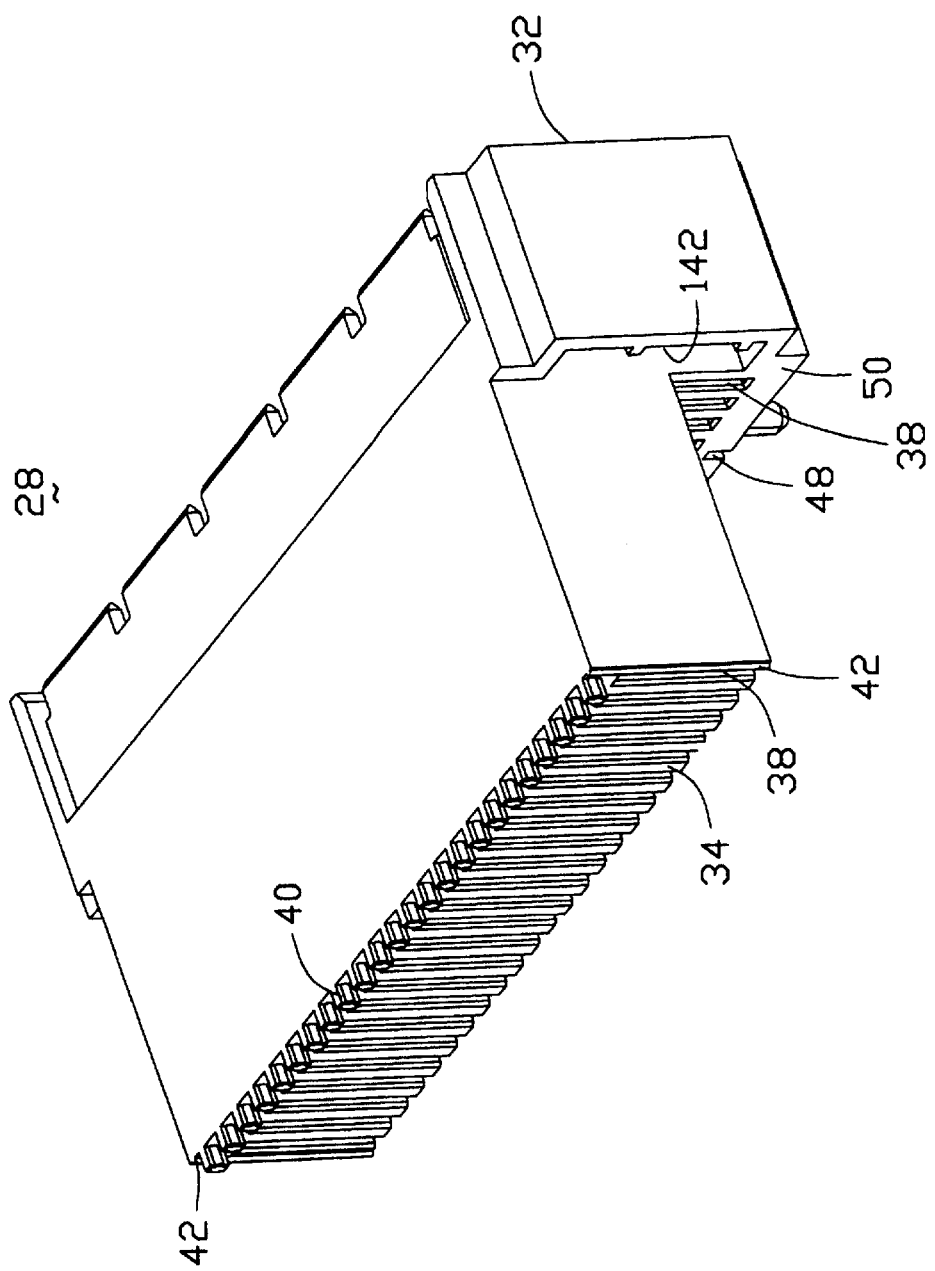
FIG. 5 is a rear-top perspective view of the first housing portion in FIG. 3.
Figure 6C:
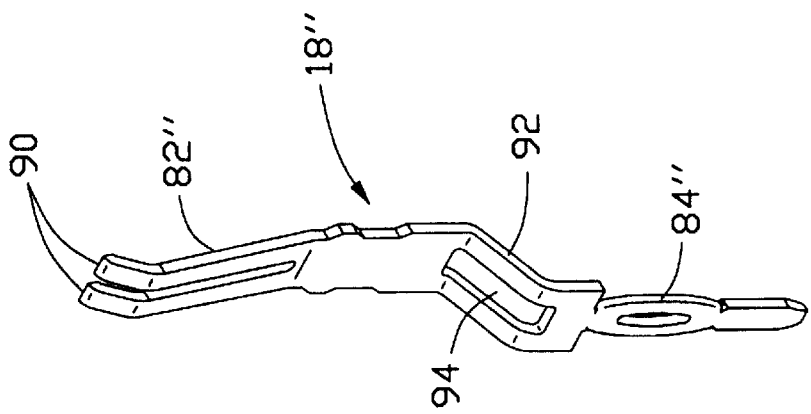
FIGS. 6A–6C are enlarged perspective views of signal contacts of the male connector in three embodiments.
Figure 6B:
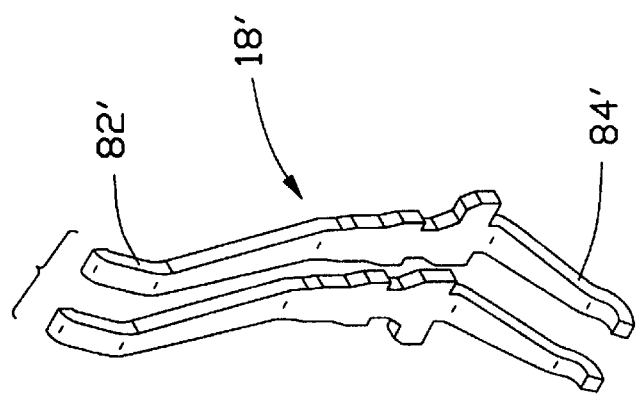
Figure 6A:
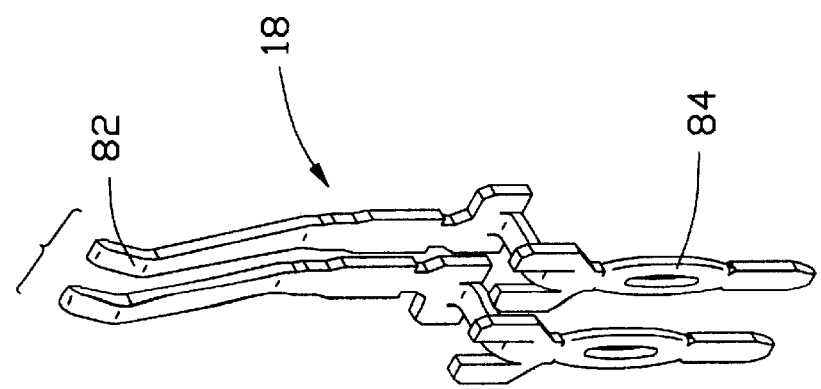
Figure 7:
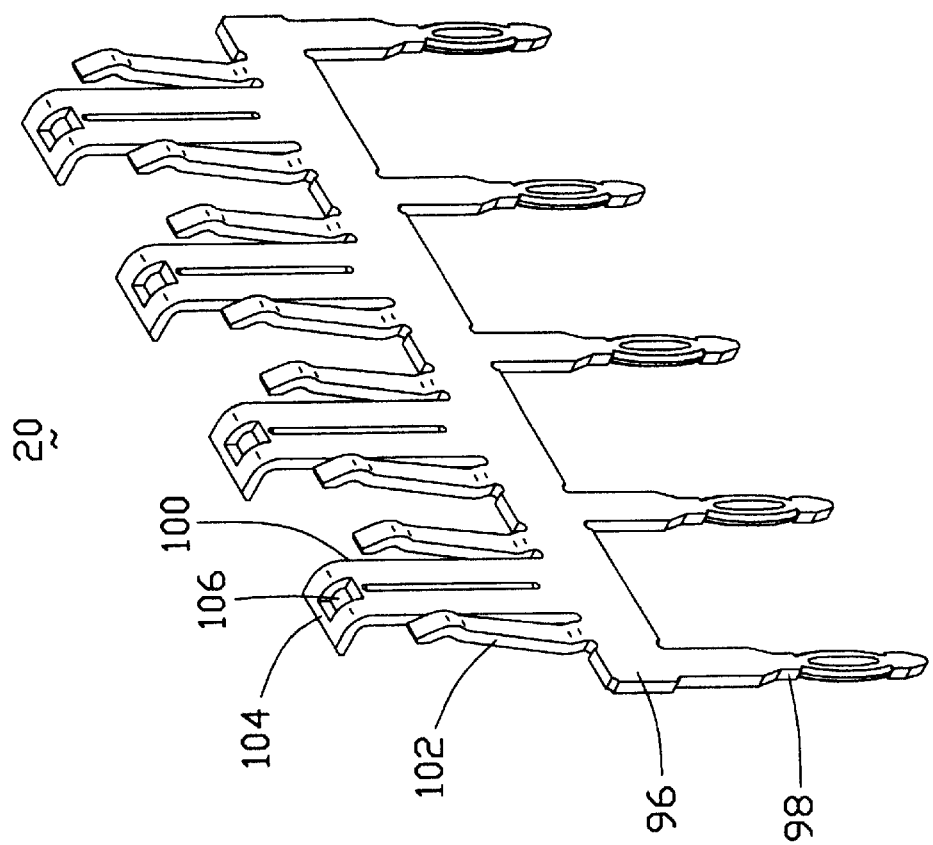
FIG. 7 is an enlarged perspective view of a grounding terminal of the male connector.
Figure 8B:
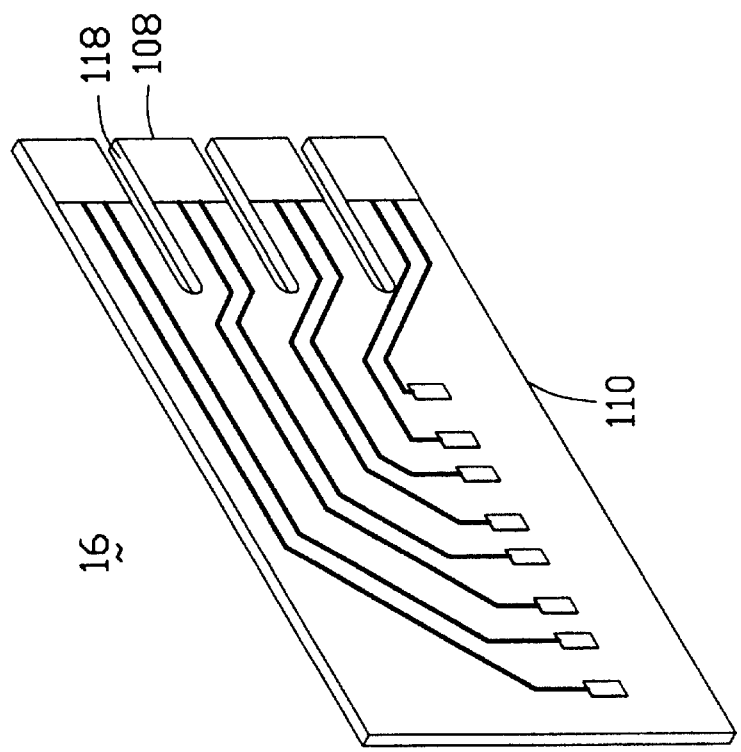
FIGS. 8A–8B are opposite perspective views of a substrate of the male connector.
Figure 8A:
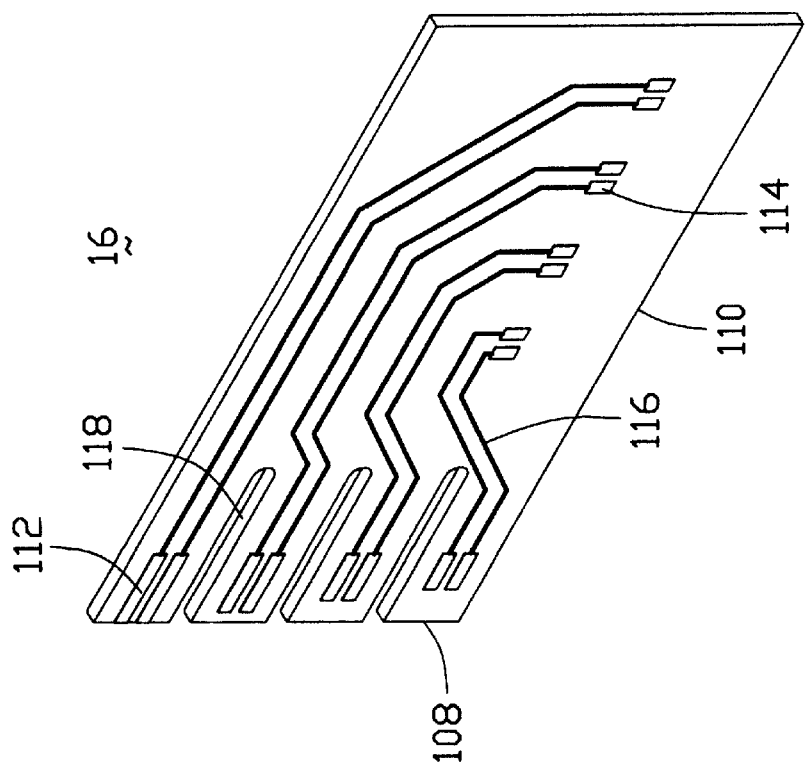

As is shown in FIGS. 1, 2 and 10, the connector assembly 1 includes a pair of guiding means 138 at opposite sides thereof for guiding the male connector 10 to correctly mate with the female connector 12. Each guiding means 138 includes a frame 140 at each side of the first housing portion 28 and a chamber 142 between the frame 140 and an near lead-in bar 44. The frame 140 provides two guiding keys 144 located on an inner surface 146 thereof and extending in a front-to-rear direction. Each guiding means 138 also includes a guiding post 148 at each side of the housing 22 with a wedged top portion 150 extending beyond a top face of the housing 22. The guiding post 148 defines two guiding cuts 152 unsymmetrically in an outer surface 154 thereof, located corresponding to the guiding keys 144. When the male connector 10 mates with the female connector 12, the wedged top portions 150 are first inserted into corresponding chambers 142 and the guiding keys 144 are received in corresponding guiding cuts 152 before the lead-in bars 44 touch the housing 22, the signal contacts 24 and the grounding terminals 26. When the guiding posts 148 are wholly received in the corresponding chambers 142, the male connector 10 securely mates with the female connector 12.

Comparing with the prior arts, this invention has a lot of advantages. First, since the substrates 16 are removeably held in the first housing portion 28, it is very convenient to replace any one of the substrates 16 with another substrate for a different function. Second, since the first edges 108 of the substrates 16 are covered by the lead-in bars 44, plated noble metal on the contacting portions 82 of the signal contacts 18 can obtain a better protection against wearing. Third, the elongate grounding terminals 20 each are attached to the second housing portion 30 by four retention latches 100, the grounding terminals 20 can be securely attached to the second housing portion 30. Fourth, since the substrates 16 are pushed by the grounding terminals 20 toward the signal contacts 18, secure electrical connections are established between the conductive pads 114 and the contacting portions 82 of the signal contacts 18.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly comprising:
   a male connector including first and second individual housing portions engaging with each other, a plurality of signal contacts and a plurality of grounding terminals attached to the second housing portion and a plurality of substrates held by the first housing portion, each substrate having an edge moveably sandwiched by the signal contacts and the grounding terminals, the first housing portion providing two frames at opposite sides thereof, each frame defining a chamber and providing at least one guiding key on an inner surface thereof; and
   a female connector including a dielectric member for engaging with the first housing portion, a plurality of signal contacts and a plurality of grounding terminals attached to the dielectric member for electrically engaging with the substrates, the dielectric member having a pair of guiding posts at opposite ends thereof, each guiding post defining at least one guiding cut in an outer surface thereof, the guiding posts being inserted in corresponding chambers of the first housing portion before the first housing portion engages with the dielectric member, the guiding posts being insertable into the corresponding chambers only when the guiding keys are received in corresponding guiding cuts.

2. The electrical connector as claimed in claim 1, wherein the first and the second housing portions each provide a row of blocks and a row of notches, the blocks of one of the first and the second housing portions being fixedly received in corresponding notches of the other of the first and the second housing portions, thereby joining the first and the second housing portions together.

3. The electrical connector as claimed in claim 2, wherein one of the first and the second housing portions provides at least one guiding rib and the other of the first and the second housing portions provides at least one guiding track, the at least one guiding rib engaging with the at least one guiding track before the engagement of the blocks with the notches of the first and the second housing portions.

4. The electrical connector assembly as claimed in claim 1, wherein the second housing portion has a plurality of elongate wafers and defines a plurality of channels between the wafers, each channel receiving one of the grounding terminals and at least one of the signal contacts confronting said one of the grounding terminal.

5. The electrical connector assembly as claimed in claim 4, wherein the first housing portion has a front surface for mating with the female connector and each substrate has a first edge adjacent the front surface and a second edge inserted in a corresponding channel of the second housing portion.

6. The electrical connector assembly as claimed in claim 5, wherein each substrate has a plurality of first conductive pads adjacent the first edge thereof, a plurality of second conductive pads adjacent the second edge thereof and a plurality of conductive traces connecting the first conductive pads with corresponding second conductive pads.

7. The electrical connector as claimed in claim 6, wherein the first housing portion defines a plurality of passageways in alignment with the channels, the substrates being received in the passageways of the first housing portion, respectively.

8. The electrical connector as claimed in claim 6, wherein the first housing portion provides a plurality of lead-in bars located adjacent the front surface thereof and covering the first edges of the substrates so that the signal contacts and grounding terminals of the female connector are prevented from wiping against of corners of the first edges of the substrates when the first housing portion engages with the dielectric member.

9. The electrical connector as claimed in claim 8, wherein the lead-in bars are wedge-shaped in cross-sections.

10. The electrical connector as claimed in claim 9, wherein the lead-in bars each have at least one branch rearwardly extending into passageways defined in the first housing portion, and wherein the substrates each define at least one groove at the first edge thereof, the at least one branch being received in the at least one groove.

11. An electrical connector comprising:
    a housing portion having a front surface adapted for mating with a mating connector and defining a plurality of passageways through the front surface, the housing portion providing a plurality of lead-in bars adjacent the front surface;
    a plurality of substrates each having a row of first conductive pads adjacent a first edge thereof, a row of second conductive pads adjacent a second edge thereof and a plurality of conductive traces connecting the first conductive pads with corresponding second conductive pads, the substrates being received in corresponding passageways of the housing portion with the first edges thereof being hidden behind corresponding lead-in bars wherein the lead-in bars are wedge shaped in cross-sections and wherein the lead-in bars each have at least one branch rearwardly extending into the passageway of the housing portion and wherein the substrates each define at least one groove at the first edge thereof, the at least one branch being received in the at least one groove.

12. An electrical connector assembly comprising:

a first connector mounted on a first printed circuit board and including a first insulative housing defining a first mating port with a plurality of blade-like mating sections therein in a spatial relationship with one another;

a pair of frames positioned at two opposite lengthwise ends of the first housing;

a second connector mounted on a second printed circuit board and including a second insulative housing defining a second mating port, a plurality of elongated wafers side by side arranged with one another so as to form a channel between every adjacent two wafers, two opposite ends of each of the wafers being spaced from longitudinal walls of the second housing;

a plurality of terminals disposed along each of said wafers; and a pair of guiding posts disposed at two opposite lengthwise ends of the second housing, wherein when mated, the blade-like mating sections are received in the corresponding channels, respectively, and longitudinal walls of the first housing, along a lengthwise direction thereof, are received between the longitudinal walls of the second housing and the wafers so that the first housing is generally enclosed by said second housing in a transverse direction perpendicular to said lengthwise direction, while the guiding posts are received in the corresponding frames respectively so that the second housing is generally enclosed by said first housing in the lengthwise direction.

* * * * *